(12) United States Patent
Wuister et al.

(10) Patent No.: US 8,454,849 B2
(45) Date of Patent: Jun. 4, 2013

(54) IMPRINT LITHOGRAPHY

(75) Inventors: Sander Frederik Wuister, Eindhoven (NL); Vadim Yevgenyevich Banine, Deurne (NL); Arie Jeffrey Den Boef, Waalre (NL); Yvonne Wendela Kruijt-Stegeman, Eindhoven (NL); Tatyana Viktorovna Rakhimova, Moscow (RU); Dmitriy Viktorovich Lopaev, Kololev (RU); Denis Alexandrovich Glushkov, Alfter (DE); Andrei Mikhailovich Yakunin, Eindhoven (NL); Roelof Koole, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 238 days.

(21) Appl. No.: 13/051,441

(22) Filed: Mar. 18, 2011

(65) Prior Publication Data
US 2011/0226735 A1 Sep. 22, 2011

Related U.S. Application Data

(60) Provisional application No. 61/316,102, filed on Mar. 22, 2010.

(51) Int. Cl.
*B44C 1/22* (2006.01)
*C23F 1/00* (2006.01)

(52) U.S. Cl.
USPC .................................................. 216/41

(58) Field of Classification Search
USPC ............ 216/41, 67; 264/40.1, 129; 427/248.1
See application file for complete search history.

(56) References Cited

U.S. PATENT DOCUMENTS

| | | | |
|---|---|---|---|
| 4,731,155 A | 3/1988 | Napoli et al. | |
| 5,772,905 A | 6/1998 | Chou | |
| 6,334,960 B1 | 1/2002 | Willson et al. | |
| 7,376,259 B1* | 5/2008 | Dakshina-Murthy et al. | 382/144 |
| 2004/0124566 A1 | 7/2004 | Sreenivasan et al. | |
| 2005/0274693 A1 | 12/2005 | Heidari et al. | |
| 2009/0212012 A1 | 8/2009 | Brooks et al. | |
| 2011/0226735 A1* | 9/2011 | Wuister et al. | 216/41 |

FOREIGN PATENT DOCUMENTS

WO 02/067055 8/2002

OTHER PUBLICATIONS

J. Haisma, "Mold-assisted nanolithography: A process for reliable pattern replication," J. Vac. Sci. Technol. B14(6), Nov./Dec. 1996.

\* cited by examiner

*Primary Examiner* — Shamim Ahmed
(74) *Attorney, Agent, or Firm* — Pillsbury Winthrop Shaw Pittman LLP

(57) ABSTRACT

An imprint lithography method is disclosed that includes, after imprinting an imprint lithography template into a layer of imprintable medium to form a pattern in that imprintable medium and fixing that pattern to form a patterned layer of imprintable medium, adding etch resistant material (i.e. a hard mask) to a part of the patterned layer of imprintable medium to reduce a difference between an intended topography and an actual topography of that part of the patterned layer of imprintable medium.

8 Claims, 8 Drawing Sheets

IMPRINT LITHOGRAPHY

This application claims priority and benefit under 35 U.S.C. §119(e) to U.S. Provisional Patent Application No. 61/316,102, entitled "Imprint Lithography", filed on Mar. 22, 2010. The content of that application is incorporated herein in its entirety by reference.

FIELD

The present invention relates to imprint lithography, and in particular (although not exclusively) to an imprint lithography method.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features (e.g. micron size or nanometer sized features, e.g., less than or equal to 10 microns, less than or equal to 1 micron, less than or equal to 50 nm, less than or equal 25 nm or less than or equal to 10 nm sized features) that has gained increasing interest is so-called imprint lithography, which generally involves the use of a "stamp" (often referred to as an imprint lithography template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint lithography template.

Imprint lithography involves the patterning of an imprintable medium on a surface of a substrate to be patterned. The patterning may involve bringing together a patterned surface of an imprint lithography template and a layer of imprintable medium (e.g., moving the imprint lithography template toward the imprintable medium, or moving the imprintable medium toward the imprint lithography template, or both) such that the imprintable medium flows into recesses in the patterned surface and is pushed aside by protrusions on the patterned surface, to adopt the topography of that patterned surface. The recesses define pattern features of the patterned surface of the imprint template. The patterned features may have features having dimensions of the order of micrometers or nanometers. Typically, the imprintable medium is flowable when the patterned surface and the imprintable medium are brought together. Following patterning of the imprintable medium, the imprintable medium is suitably brought into a non-flowable or frozen state (i.e. a fixed state), for example by illuminating the imprintable medium with actinic radiation. The patterned surface of the imprint lithography template and the patterned imprintable medium are then separated. The substrate and patterned imprintable medium are then typically processed further in order to pattern or further pattern the substrate (e.g. by etching or the like). The imprintable medium may be provided in the form of droplets on the surface of a substrate to be patterned, but may alternatively be provided using spin coating or the like.

SUMMARY

In optical lithography, where a beam of radiation is passed through or reflected off a patterning device (such as a mask or the like), the radiation beam will be patterned according to the pattern provided by the patterning device. The patterned radiation beam is then projected onto a substrate in order to provide patterns on that substrate. Due to non-uniformities in the patterning device, or other elements of an optical lithography apparatus, the pattern projected onto the substrate may not be as intended. For example, heating of the patterning device or a projection system used to project the patterned radiation beam onto the substrate may cause the patterning device or projection system to deform, which may in turn introduce non-uniformities into the patterned radiation beam that is projected onto the substrate. Non-uniformities in the pattern provided on the substrate may comprise, for example, an increase or a decrease in dimensions of patterns of the radiation beam and thus in features provided on the substrate. It is desirable to ensure that the pattern features are provided on the substrate in a uniform and consistent manner across the substrate.

In order to overcome the problem of non-uniformities, the radiation dose provided by one or more parts of the radiation beam may be controlled in order to change the dose of radiation that is provided on different areas of the substrate. For instance, the dose of radiation may be decreased in areas where it is known that non-uniformities in the lithographic apparatus (or during subsequent processing) would otherwise result in pattern features being applied to the substrate with dimensions that are larger than intended. Similarly, the dose of radiation may be increased if it is known that the non-uniformities in the lithographic apparatus will result in pattern features having dimensions smaller than intended.

In imprint lithography, similar problems can be encountered, but cannot be overcome in the manner discussed above in relation to optical lithography (i.e. by changing the local dose of radiation). For instance, in imprint lithography, the imprint lithography template is the patterning device. When the imprint lithography template is constructed, non-uniformity in one or more of the pattern features (i.e. a topography) of the imprint lithography template may arise, for example, due to local variation in process conditions used in the manufacture of the imprint lithography template. Such variation may arise from, for example, plasma concentrations, e-beam writing errors and the like. During an imprint, the imprint lithography template is imprinted into imprintable medium. In one example, actinic radiation (e.g. UV radiation) is used to irradiate the imprintable medium to fix the pattern provided in the imprintable medium by the imprint lithography template. Thus, it will be appreciated that a change in dose of the actinic radiation does not have a real effect on a dimension of a pattern feature provided on the substrate, since the dimension of the pattern feature (i.e. dimension of a topography) is dictated by the dimension of the pattern feature (i.e. the topography) of the imprint lithography template which is fixed. Thus, non-uniformity in an imprint lithography template can present a problem.

It is an aim of an embodiment of the present invention to provide an imprint lithography method that obviates or mitigates at least one problem of the art, whether identified herein or elsewhere, or which provides an alternative to an existing imprint lithography method.

According to an aspect of the invention, there is provided an imprint lithography method comprising, after imprinting an imprint lithography template into a layer of imprintable medium to form a pattern in that imprintable medium and fixing that pattern to form a patterned layer of imprintable medium: adding etch resistant material to a part of the patterned layer of imprintable medium, to reduce a difference between an intended topography and an actual topography of that part of the patterned layer of imprintable medium.

The etch resistant material may be added using chemical vapor deposition.

The etch resistant material may be added by heating of the etch resistant material, or a substance from which the etch resistant material is derivable, located in a vicinity of the part of the patterned layer of imprintable medium, or in contact with the part of the patterned layer of imprintable medium. The heating may be provided using by one or more beams of radiation.

Heating may be provided by directing a beam of radiation toward the patterned layer of imprintable medium, the radiation beam having a radiation intensity profile configured such that etch resistant material is added substantially only to the part of the patterned layer of imprintable medium.

Heating may be provided by scanning a beam of radiation relative to the patterned layer of imprintable medium, the radiation beam being modulated during scanning such that etch resistant material is added substantially only to the part of the patterned layer of imprintable medium.

Heating may be provided by intersecting two or more beams of radiation at a point adjacent to the part of the patterned layer of imprintable medium.

Prior to adding etch resistant material to a part of the patterned layer of imprintable medium, the method comprises providing etch resistant material in fluid (e.g. gaseous or liquid) form, or a substance from which etch resistant material is derivable, in a vicinity of the part of the patterned layer of imprintable medium, or in contact with the part of the patterned layer of imprintable medium.

The actual topography of the part of the patterned layer of imprintable medium may be determined by measuring a topography of the part of the patterned layer of imprintable medium.

The actual topography of the part of the patterned layer of imprintable medium may be determined by measuring a topography of a part of the imprint lithography template that was used to form the part of the patterned layer of imprintable medium.

According to an aspect of the invention, there is provided an imprint lithography method comprising, after imprinting an imprint lithography template into a layer of imprintable medium to form a pattern in that imprintable medium and fixing that pattern to form a patterned layer of imprintable medium: removing a part of the patterned layer of imprintable medium, to reduce a difference between an intended topography and an actual topography of that part of the patterned layer of imprintable medium, the removal being undertaken using a plasma applied locally to that part of the patterned layer of imprintable medium.

One or more plasmas may be provided using an addressable array of plasma formation sites (e.g. in excess of 10, 100, or 1000 formation sites).

A pitch between each plasma formation site may be around 100 µm or less.

Each plasma formation site may a cavity (e.g. having a cross-section of 100 µm or less by 100 µm or less). The shape of the cavity may be chosen to provide a desired plasma distribution.

The plasma may be produced using an electrical discharge. The electrical discharge may be produced using one or more impulses each having a duration of about 10 ns to 300 ns. The one or more impulses may have, alternatively or additionally, a repetition rate of around 1 MHz.

A mask may be provided for spatial control of the plasma.

A mask may be located between an addressable array of plasma formation sites and the patterned layer of imprintable medium for spatial control of the plasma.

The plasma may be produced using an electrical discharge in the presence of a gas comprising one or more of He, Ar, Ne, $N_2$, $H_2$, or a mixture of one or more of He, Ar, Ne, $N_2$, or $H_2$.

The actual topography of the part of the patterned layer of imprintable medium may be determined by measuring a topography of the part of the patterned layer of imprintable medium.

The actual topography of the part of the patterned layer of imprintable medium may be determined by measuring a topography of a part of the imprint lithography template that was used to form the part of the patterned layer of imprintable medium.

According to an aspect of the invention, there is provided a device, or an imprint lithography template, obtained using an imprint lithography method described herein.

BRIEF DESCRIPTION OF THE DRAWINGS

Specific embodiments of the invention will be described with reference to the accompanying Figures, in which.

DETAILED DESCRIPTION

Figure 1A:
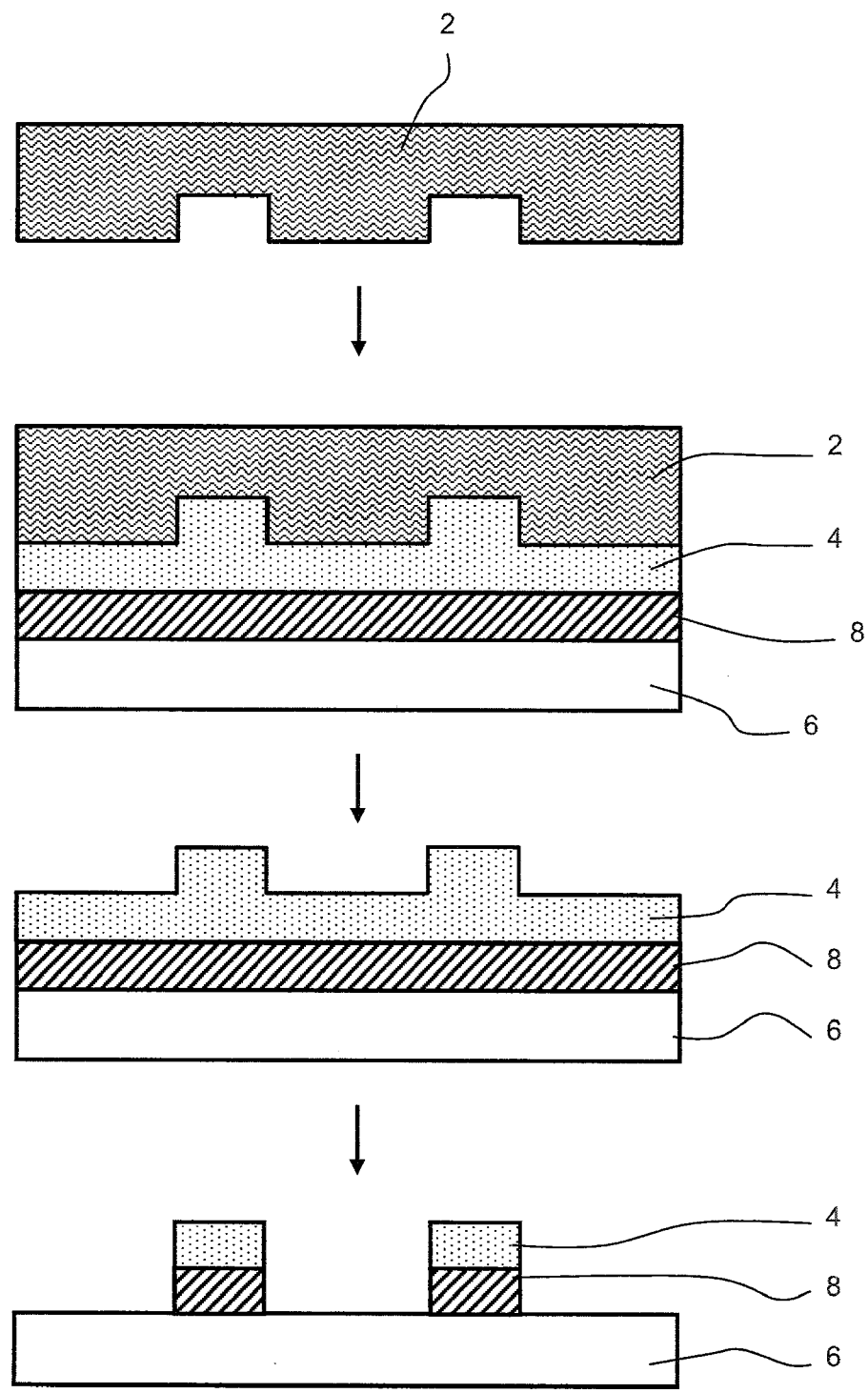
FIGS. 1A and 1B schematically depict examples of, respectively, hot imprint, and UV imprint lithography.
Figure 1B:
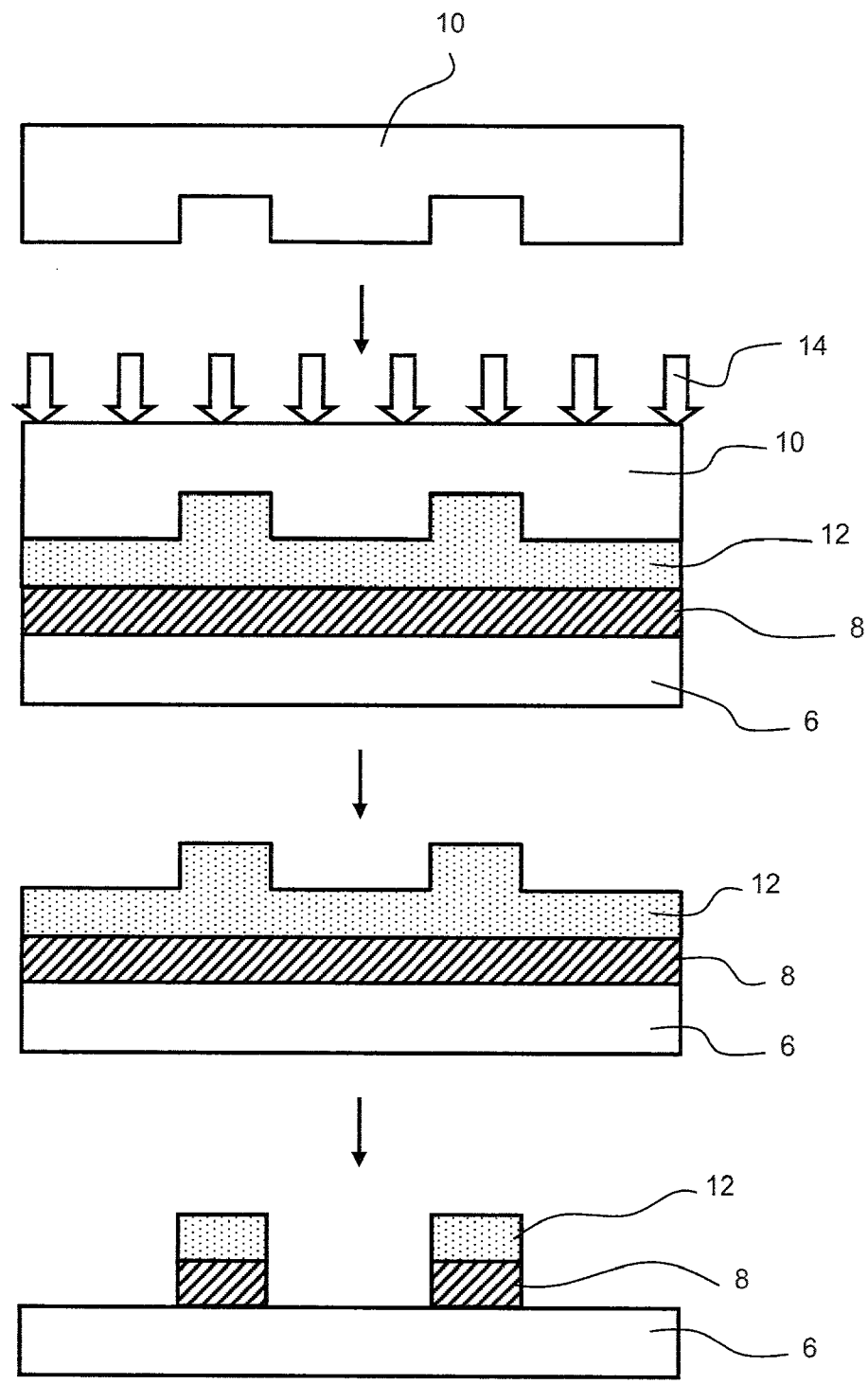

Examples of two known approaches to imprint lithography are schematically depicted in FIGS. 1A to 1B.

FIG. 1A shows an example of so-called hot imprint lithography (or hot embossing). In a typical hot imprint process, a template 2 is imprinted into a thermosetting or a thermoplastic imprintable medium 4, which has been cast on the surface of a substrate 6. The imprintable medium 4 may be, for example, resin. The resin, for instance, may be spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 2 may then be removed and the patterned resin cooled. In hot imprint lithography employing a layer of thermoplastic polymer resin, the thermoplastic resin is heated so that it is in a freely flowable state immediately prior to imprinting with the template 2. It may be necessary to heat a thermoplastic resin to a temperature considerably above the glass transition temperature of the resin. The template is pressed into the flowable resin and then cooled to below its glass transition temperature with the template 2 in place to harden the pattern. Thereafter, the template 2 is removed. The pattern will consist of the features in relief from a residual layer of the imprintable medium which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. No. 4,731,155 and U.S. Pat. No. 5,772,905.

FIG. 1B shows an example of UV imprint lithography, which involves the use of a transparent or translucent imprint lithography template 10 which is transmissive to UV radiation and a UV-curable liquid as imprintable medium 12 (the term "UV" is used here for convenience but should be interpreted as including any suitable actinic radiation for curing the imprintable medium). A UV curable liquid is often less viscous than a thermosetting or thermoplastic resin used in hot imprint lithography and consequently may move much faster to fill template pattern features. A quartz template 10 is applied to a UV-curable resin 12 in a similar manner to the process of FIG. 1A. However, instead of using heat or temperature cycling as in hot imprint lithography, the pattern is frozen (i.e. fixed) by curing the imprintable medium 12 with UV radiation 14 that is applied through the quartz imprint lithography template 10 onto the imprintable medium 12. After removal of the imprint lithography template 10, the imprintable medium 12 is etched (and/or undergoes other further processing) to, for example provide pattern features in or on the substrate 6. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are possible. See, e.g., U.S. Patent Application Publication No. 2005-0274693, which mentions a combination of heating and UV curing an imprintable medium.

Figure 2A:
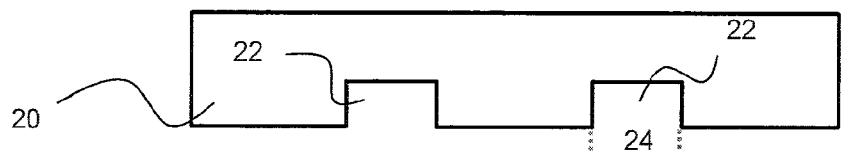
FIG. 2A schematically depicts an imprint lithography template having pattern features with intended dimensions.

FIG. 2A schematically depicts an imprint lithography template 20. The imprint lithography template 20 is provided with recesses 22 which form pattern features which can be imprinted into, and used to form pattern features in an imprintable medium, as described above. One or more of the recesses 22 may have a width 24 (or another dimension) which is as intended when the imprint lithography template 20 was designed and then constructed.

During the construction of an imprint lithography template, it is possible that one or more pattern features, such as one or more recesses or protrusions, have a dimension which is not as intended in the design of the imprint lithography template. For instance, the pattern features of the imprint lithography template may have a uniformity profile which varies across the imprint lithography template. Such uniformity variation of the dimensions of pattern features may arise, for example, due to a variation in the processing conditions used to manufacture the imprint lithography template. For instance, such variation in processing conditions may be due to a local variation or the like in plasma concentrations or densities, or e-beam writing errors, or the like.

Figure 2B:
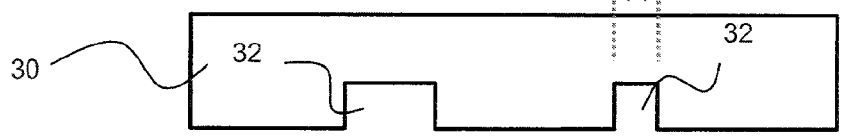
FIG. 2B schematically depicts an imprint lithography template having pattern features with actual dimensions that differ from the intended dimensions.

FIG. 2B schematically depicts an imprint lithography template 30 provided with recesses 32. Due to the non-uniformity in the manufacturing process used to manufacture the imprint lithography template 30, one or more of the recesses 32 may have an actual width 34 which is smaller than intended (e.g. smaller than the width of the comparable recess shown in and described with reference to FIG. 2A).

If the imprint lithography template 30 has one or more recesses 32 (or other pattern features) which have a dimension that is not as intended, a pattern feature provided on a substrate using the imprint lithography template 30 will also have a dimension that is not as intended.

Figure 3:
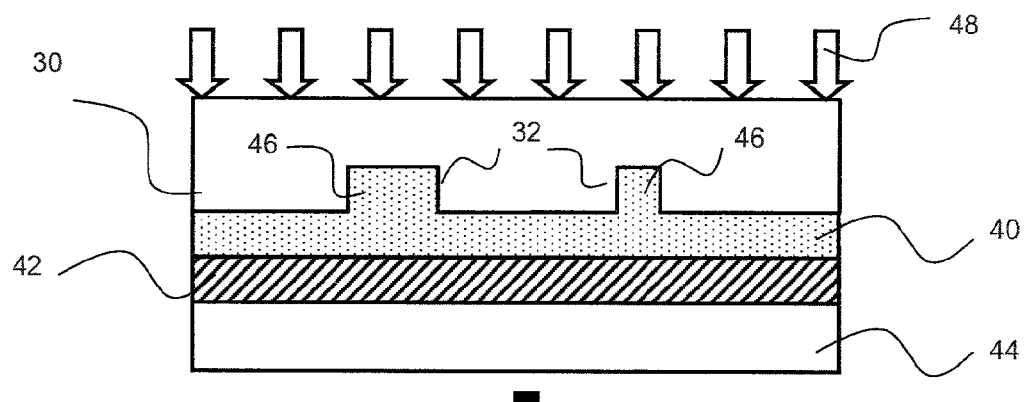
FIG. 3 schematically depicts an imprint lithography process using the imprint lithography template shown in and described with reference to FIG. 2B.
Figure 3:
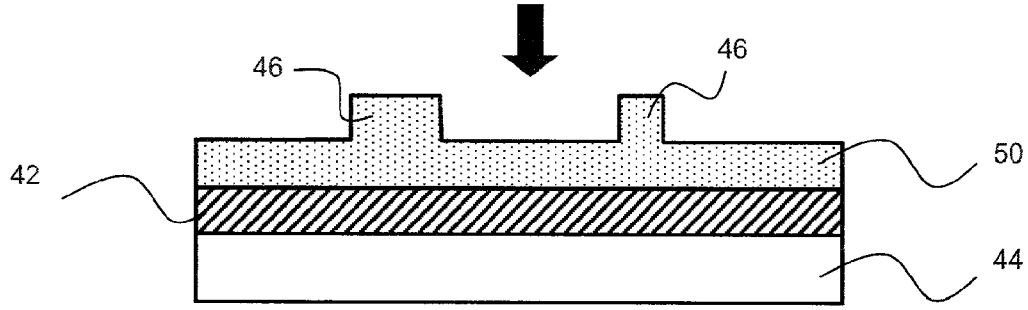
Figure 3:
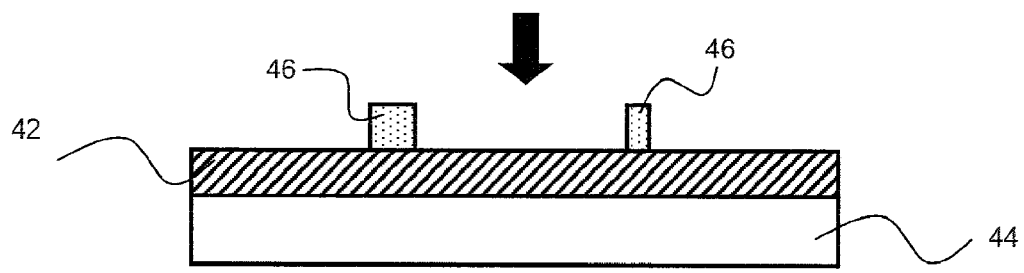
Figure 3:
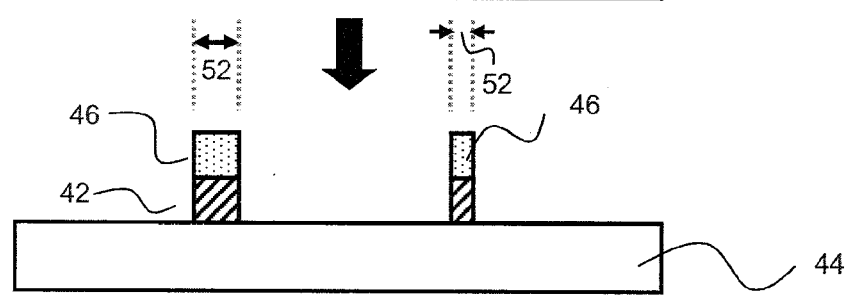

FIG. 3 schematically depicts a imprint lithography method using the imprint lithography template 30 of FIG. 2B. In a first part of the method, the imprint lithography template 30 is imprinted into a layer of imprintable medium 40. The layer of imprintable medium 40 is provided on an optional planarization and transfer layer 42 provided on substrate 44. Imprintable medium forms pattern features 46 by flowing into and filling recesses 32 of the imprint lithography template 30. Actinic radiation 48 is used to irradiate and fix the imprintable medium 40 and thus the pattern features 46.

In a next step of the method, the imprint lithography template 30 is released from the imprintable medium, and leaves pattern features 46 and a residual layer 50 of imprintable medium.

In a next step of the method, a breakthrough etch is undertaken to remove the residual layer 50 of the imprintable medium and leave only the pattern features 46 on the planarization and transfer layer 42. The width of the pattern features 46 is reduced during the etch, for example by a few percent or less (exaggerated in the Figure for clarity).

In a next step of the method, a transfer etch is undertaken to remove parts of the planarization and transfer layer 42 not covered by the pattern features 46. Widths 52 of the pattern features 46 correspond to the widths of the recesses 32 of the imprint lithography template 30 used to provide those pattern features 46, as would be expected. Thus, a width 52 of one of the pattern features will be smaller than intended.

Figure 4:
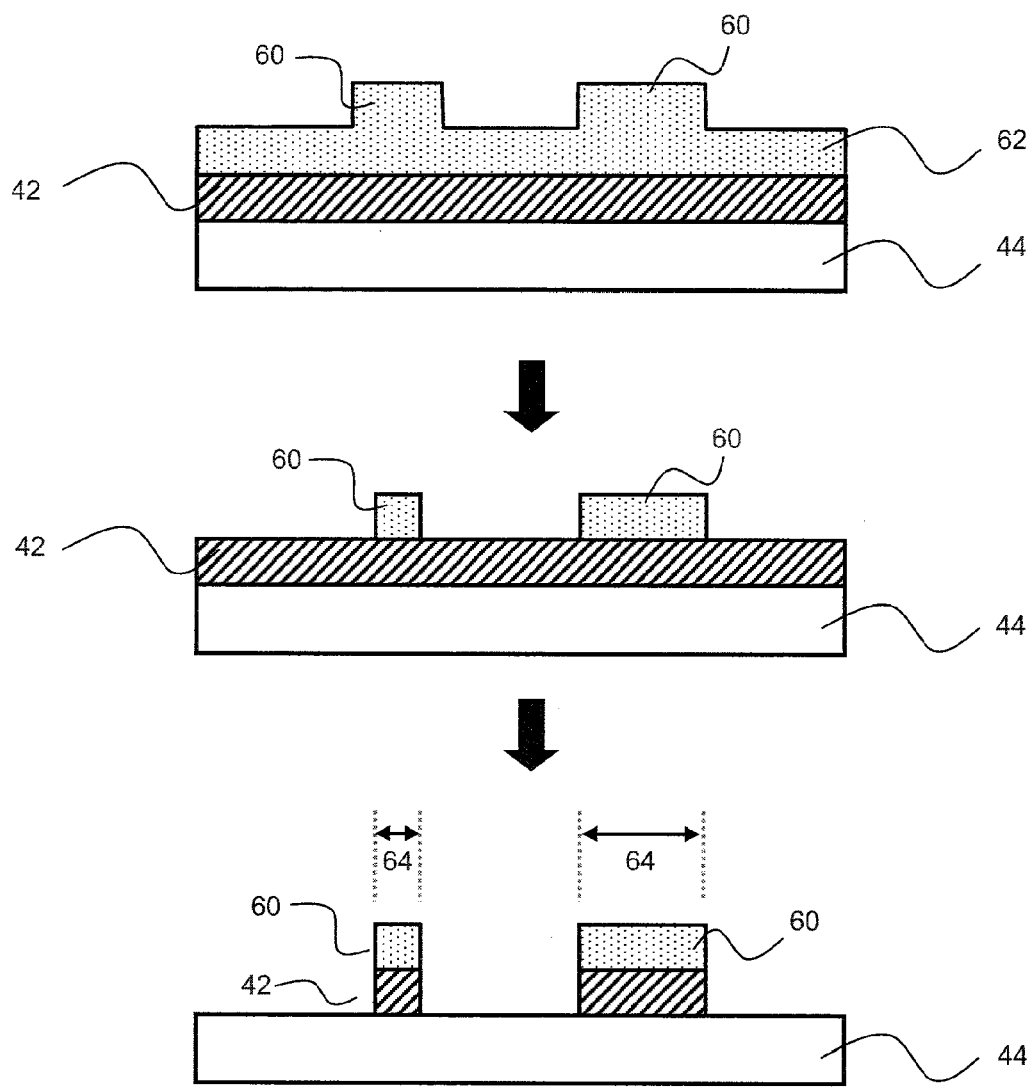
FIG. 4 schematically depicts an imprint lithography process using a different imprint lithography template.

FIG. 4 depicts an alternative situation, where an imprint template having a feature with an actual dimension that is larger than intended has been used to provide pattern features 60 in a layer of imprintable medium 62. FIG. 4 shows that one of the pattern features 60 provided in the layer of imprintable medium 62 has a width 64 that is greater than intended.

From a review of FIGS. 3 and 4, it will be appreciated that despite there being an intention to provide pattern features on a substrate having uniform width (in this example), the widths of the resultant pattern features are in fact not uniform. This is due to non-uniformity in the widths of recesses in the imprint lithography template used to provide those pattern features (i.e. one or more of the widths do not conform to the one or more intended widths). It is desirable to reduce or eliminate the occurrence of such non-uniformity or variation from intended dimension, in the dimension of a pattern feature provided on a substrate.

For brevity and clarity, it will be appreciated that the use of the term "non-uniformity" is intended to encompass the situation where an actual dimension of a pattern feature provided on the substrate does not conform to or with an intended dimension of the pattern feature—i.e. the actual dimension does not conform to or with an intended dimension due to a non-uniformity in, for example, the manufacture of the imprint lithography template. Thus, the term "non-uniformity" encompasses non-conformity.

According to an aspect of the invention, there is provided an imprint lithography method for reducing a difference between an intended topography and an actual topography of a part of a patterned layer of imprintable medium (i.e. to reduce a non-uniformity in a part of a patterned layer of imprintable medium). The part of the patterned layer of imprintable may be, or comprise, one or more pattern features (e.g. recesses or protrusions).

In an embodiment, after imprinting an imprint lithography template into a layer of imprintable medium to form a pattern in that medium, and fixing that pattern to form a patterned layer of imprintable medium, the method comprises adding etch resistant material (sometimes referred to as constituting, forming, or being a hard mask) to a part of the pattern layer of imprintable medium, to reduce a difference between an intended topography and an actual topography of that part of the patterned layer of imprintable medium.

'After imprinting an imprint lithography template into a layer of imprintable medium to form a pattern in that medium, and fixing that pattern to form a patterned layer of imprintable medium' may be described in an alternative manner as, for example: after contacting an imprint lithography template with imprintable medium provided on a substrate and fixing the imprintable medium to obtain/form/provide a patterned layer of imprintable medium.

In an additional or alternative aspect of the invention, there is provided an imprint lithography method which comprises, after imprinting an imprint lithography template into a layer of imprintable medium to form a pattern in that medium, and fixing that pattern to form a patterned layer of imprintable medium, removing a part of the patterned layer of imprintable medium, to reduce a difference between an intended topography and an actual topography of that part of the patterned layer of imprintable medium. The removal is undertaken using a plasma, for example applied locally to that particular part of the patterned layer of imprintable medium (as opposed to globally, across the entire patterned layer).

By adding material to, or removing material from particular parts (e.g. regions or the like) of the patterned layer of imprintable medium, local differences between an intended topography and an actual topography can be reduced or eliminated in a local manner.

The aspects and embodiments of the present invention can be used in isolation, or in combination, for example on different areas of a patterned layer of imprintable medium, or for different parts of the patterned layer of imprintable medium.

Figure 5A:
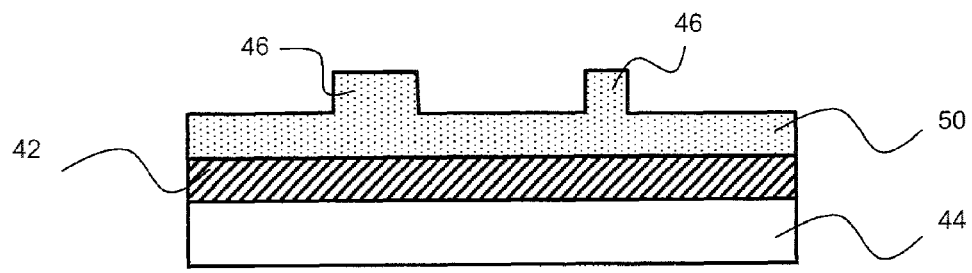
FIGS. 5A to 5C schematically depict general principles associated with an imprint lithography method according to an embodiment of the invention.
Figure 5B:
Figure 5B:
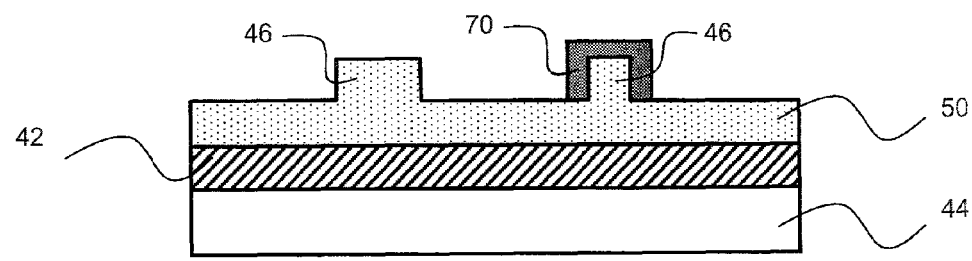
Figure 5C:
Figure 5C:
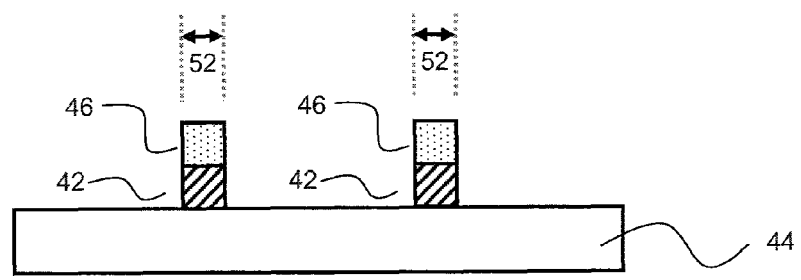

FIGS. 5A to 5C schematically depict general principles associated with an aspect of the present invention.

FIG. 5A schematically depicts a residual layer of imprintable medium 50 on which pattern features 46 have been formed. An imprint lithography template used to form the pattern features 46 included a pattern feature with an actual dimension (e.g. a width) which was smaller than intended. For this reason, one of the pattern features 46 also has an actual width smaller than intended. It will be appreciated that FIG. 5A represents a point in the imprint lithography process or method shown in and described with reference to FIG. 3.

FIG. 5B shows that in order to reduce a difference between an intended topography and an actual topography of the pattern feature 46 having a width that is smaller than intended, etch resistant material 70 (i.e. a hard mask) is added to that pattern feature 46. The amount of etch resistant material that is added is controlled such that, after such addition, the difference between the intended topography and the actual topography of the pattern feature is reduced or eliminated.

The etch resistant material 70 may be added in any appropriate manner. In one example, the etch resistant material 70 may be added using chemical vapor deposition, or the like, for example photo chemical vapor deposition. For instance, prior to adding etch resistant material to the part of the patterned layer of imprintable medium where the topography is to be corrected (i.e. a difference between an actual and intended topography is to be reduced), etch resistant material in fluid form (e.g. in a liquid or gaseous state), or a substance from which the etch resistant material is derivable, may be introduced into the vicinity of that part of the patterned layer of imprintable medium, or in contact with that part of the patterned layer of imprintable medium. Localized heating of the fluid etch resistant material, or the material from which the etch resistant material is derivable, can be implemented to help ensure that etch resistant material is locally added (e.g. deposited) onto a specific pattern feature, region of pattern features, or in more general terms a specific part of the patterned layer of imprintable medium.

Localized heating may be undertaken using discrete conductive/radiative heating elements or the like. However, a convenient way of providing localized heating is via the use of one or more beams of radiation, for example, infrared radiation or any radiation which is sufficient in intensity and/or wavelength and/or energy to allow for the addition of etch resistant material (e.g. from a fluid state) in solid form to the part of the layer of imprintable medium. An embodiment involved in the use of such beams of radiation will be discussed in more detail below in relation to FIG. 6.

Referring to FIG. 5B, after the etch resistant material 70 has been added, one or more etches or the like may be undertaken in order to remove any excess amount of imprintable medium, leaving only the pattern features 46 (on top of part of the planarization layer 42) on the substrate 44. This is shown in FIG. 5C, and the etch process is substantially as described above in relation to FIG. 3. It can be seen that the widths 52 of the pattern features 46 are substantially the same, and have actual widths 52 substantially as intended.

Figure 6A:
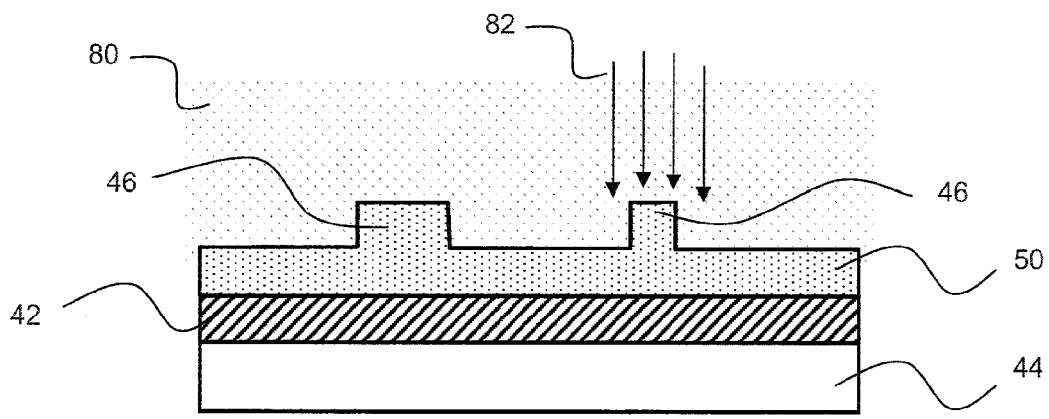
FIGS. 6A and 6B schematically depict an exemplary implementation of the more general method shown in and described with reference to FIGS. 5A to 5C.
Figure 6B:
Figure 6B:
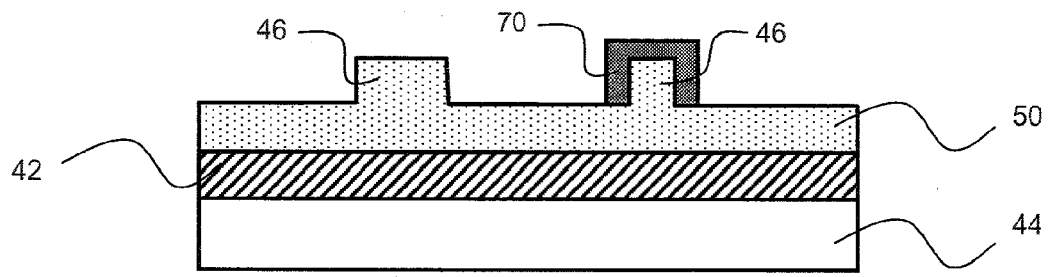

The use of radiation beams to provide heat to add etch resistant material to a particular part of the patterned layer of imprintable medium has already been discussed. FIG. 6A schematically depicts how etch resistant material may be added to a part of a patterned layer of imprintable medium by the use of one or more beams of radiation. Firstly, etch resistant material in fluid form 80, or material (e.g. solid or fluid material) from which such etch resistant material is derivable, is provided in the vicinity of and/or in contact with the layer of imprintable medium 50 and pattern features 46. Next, a beam of radiation 82 is provided, for example by a laser or the like. The beam of radiation 82 is configured to provide the required heating of required part (e.g. area, region or volume) of the etch resistant material in fluid form 80, in order to add (by deposition or the like) appropriate amounts of etch resistant material to an appropriate pattern feature or region of pattern features 46 of the patterned layer of imprintable medium 46, 50.

In one example, the heating may be provided by directing the beam of radiation 82 towards the patterned layer of imprintable medium 46, 50, and ensuring that the radiation beam 82 has a radiation intensity profile which is configured such that etch resistant material is added substantially only to the part of the patterned layer of imprintable medium where correction of a topography is required. For example, this may be achieved by using a mask or the like located in a beam path between the patterned layer of imprintable medium 46, 50 and a source of the radiation.

In another example, there may be relative scanning motion between the radiation beam 82 and the patterned layer of imprintable medium 46, 50. The radiation beam 82 may be modulated during the scanning to help ensure that etch resistant material is added substantially only to the part of the patterned layer of imprintable medium 46, 50 where correction of the topography is desired (e.g. by appropriate variation in intensity of the radiation beam 82 as the scanning takes place).

In a further example (not shown) the heating may be provided by intersecting two or more beams of radiation at a point adjacent to or at the part of the patterned layer of imprintable medium 46, 50 where correction of the topography is desired by addition of the etch resistant material. Any one beam in isolation may not provide sufficient energy to result in the addition of material to the layer of imprintable medium, but the intersection of two or more beams of radiation will result in the energy at the intersection point exceeding a threshold value to ensure that addition of the material to the part of the patterned layer of imprintable medium 46, 50 takes place.

The use of radiation beams to provide heating in this way is desirable in comparison with, for example, a discrete conducting/radiating heating element or the like. This is because the position and intensity of a radiation beam may be controlled accurately, quickly, and with a high degree of resolution, which may not be possible (or at least as easy to undertake) with a conductive/radiative heating element or the like.

Figure 7A:
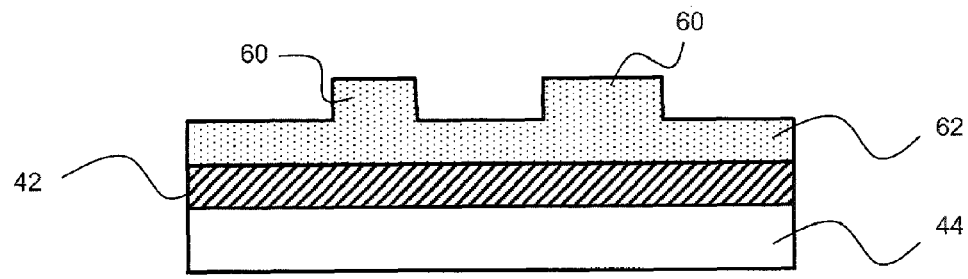
FIGS. 7A to 7C schematically depict general principles associated with an imprint lithography method according to a further embodiment of the invention.
Figure 7B:
Figure 7B:
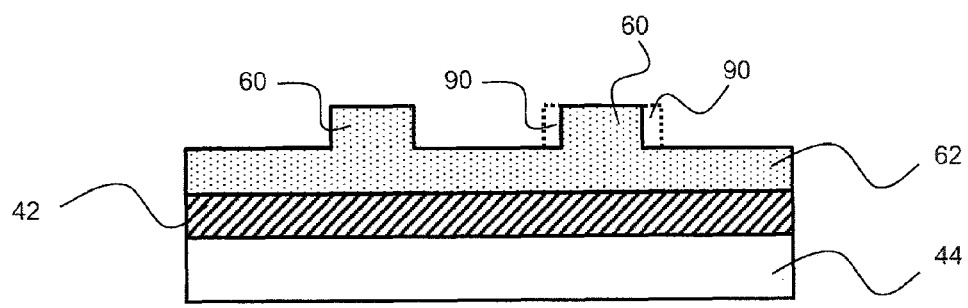
Figure 7C:
Figure 7C:
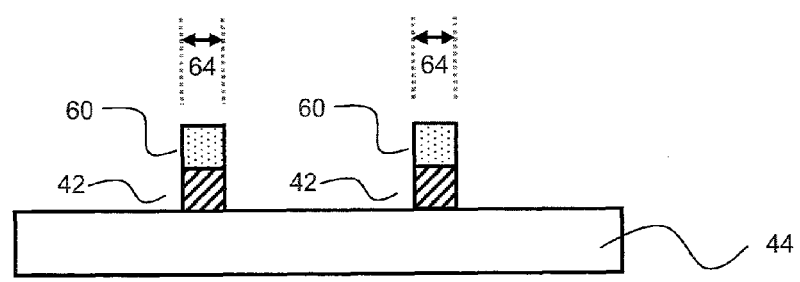

FIG. 7A to 7C schematically depicts general principles associated with a further aspect of the present invention.

FIG. 7A shows pattern features 60 that have been provided in a layer of imprintable medium 62 in a manner as discussed in more detail in relation to FIG. 4 (and, to some extent, FIG. 3). In summary, an imprint has taken place with an imprint lithography template which has at least one pattern feature which is larger than intended, which has resulted in a pattern feature being formed in the layer of imprintable medium 62 which has a width (in this example) which is also larger than intended.

FIG. 7B shows that for the pattern feature 60 which is larger than intended, parts 90 of the pattern feature 60 are removed, to reduce a difference between an intended topography and an actual topography (e.g. width, height or the like) of that pattern feature 60. The removal of the parts 90 of the pattern feature 60 is undertaken using a plasma applied (e.g. provided) locally to that part of the pattern feature 60.

FIG. 7C shows that after the correction of the topography, and subsequent processing (e.g. etching or the like) the resultant pattern features 60 provided on the substrate 44 have substantially the same widths 64, and substantially as intended.

Figure 8A:
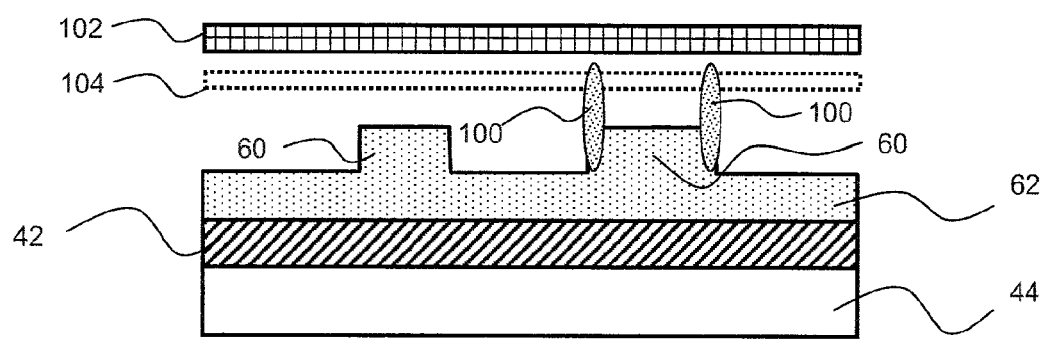
FIGS. 8A and 8B schematically depict an exemplary implementation of the more general method shown in and described with reference to FIGS. 7A to 7C.
Figure 8B:
Figure 8B:
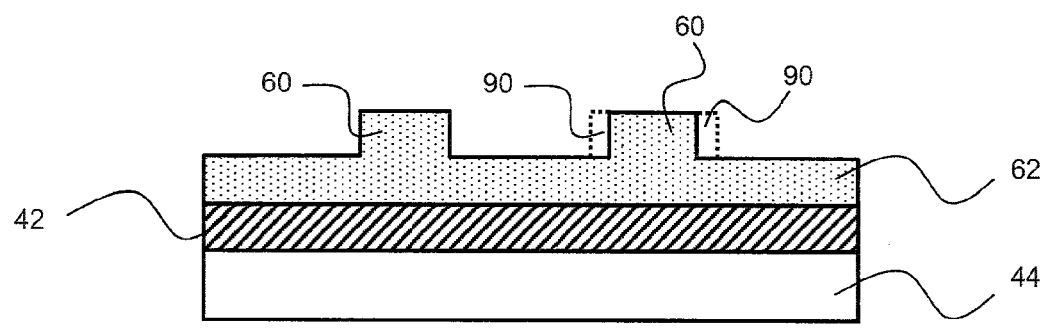

FIGS. 8A and 8B show how the general principles shown in and described with reference to FIGS. 7A and 7C may be implemented in practice.

FIG. 8A shows that one or more plasmas 100 (i.e. region of plasma or region containing or constituting plasma) may be provided using an addressable array of plasma formation sites 102. An addressable array of plasma formation sites 102 is desirable, since this allows accurate and local control of the provision of a plasma or plasmas, and thus accurate and local control of the removal of material from the layer of imprintable medium 60, 62.

A pitch between each plasma formation site may be around 100 μm or less. Typically, any deformity or inconsistency in the creation of the imprint lithography template which may result in the topography of the pattern features of the imprint lithography template not as intended will be on a scale of 100 μm or more. Thus, having pattern formation sites arranged at a pitch of around 100 μm allows the topography of a part of the patterned layer of imprintable medium 60, 62 of a comparable dimension to be corrected for.

Each plasma formation site may be or comprise a cavity. An electrical discharge may be provided within or adjacent to the cavity in order to form the plasma. Each cavity may be shaped, by trial and error, experimentation or modelling, to provide a desired plasma distribution, for instance a desired shape of plasma, in order to appropriately effect the removal of material in certain positions or along certain directions and the like from the layer of imprintable medium.

Alternatively or additionally, a mask 104 may be located between the array of plasma formation sites 102 and the patterned layer of imprintable medium 60, 62, for additional or alternative spatial control of the plasma.

An electrical discharge used to create the plasma may be produced using electrical impulses having a duration of about 10 ns to 300 ns, and/or impulses with a repetition rate of around 1 MHz. If the electrical discharge is generated in this manner, the plasma may be satisfactorily created without heating (or excessive heating) of the patterned layer of imprintable medium or the surrounding environment or the like, which may otherwise result in thermal distortion of the pattern features (permanent or temporary), which may be undesirable.

The plasma may be produced using an electrical discharge in the presence of a gas comprising one or more of (or a mixture of one or more of) He, Ar, Ne, $N_2$, or $H_2$. He (i.e. helium) may be desirable, since He is chemically stable and is not reactive. Furthermore, He does not cause surface charging of the substrate or patterned layer of imprintable medium provided thereon, which may be undesirable, since metastable He atoms created by the electrical discharge are electrically neutral. Furthermore, He is a gas that is proposed as a gas that may be used for other reasons during an imprint lithography process, and thus in an imprint lithography apparatus, due to its high diffusion rate through quartz or fused silica imprint templates and imprintable media which can result in a faster imprint method as a whole.

FIG. 8B shows the pattern features 60 after the larger pattern feature has had its topography corrected so that all pattern features 60 have substantially the same dimension, and substantially those as intended.

It will be appreciated that in order to produce a difference between an actual topography of a part of a pattern layer of imprintable medium and an intended topography, the actual topography needs to be determined. This can be undertaken by measuring (i.e. determining) a topography of the part of the patterned layer of imprintable medium after imprinting, for example using one or more optical inspection techniques or the like. Alternatively, the actual topography may be determined or derived or measured by measuring a topography of a part of the imprint lithography template that was, or is to be, used to form the part of the patterned layer of imprintable medium.

In the embodiments described above, the correction of the topography of a single pattern feature has been shown. In practice, a correction in topography may be required across a number or area of pattern features. Correction of the topography of a single pattern feature is achievable, but only if the addition or removal of material to correct the topography can be undertaken on the scale of the pattern feature, while desirably not affecting the topography of adjacent pattern features.

In practice, a change from an intended topography may extend across and include a plurality of pattern features, due to the nature of the process condition that caused the change in topography (e.g. a micrometer or greater sized region of non-uniformity in etch conditions, or the like). Thus, for cost and complexity reasons, it may not be required or desirable to provide a method that is able to correct for non-uniformity in a topography of a single pattern feature.

An embodiment of the present invention relates to imprint lithography methods. The imprint lithography method may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. The imprint lithography methods may also be used to obtain an imprint lithography template. This might be advantageous, since an imprint lithography template made in this manner will have a topography which is as intended, or one that is closer to that intended. Thus, all devices or the like made using the imprint lithography template made in this manner will also have a topography which is as intended, or one that is closer to that intended.

The pattern features described above may have one or more sub-micron (e.g. of the order of nanometers) dimensions.

In this specification, the term "substrate" is meant to include any surface layer forming part of the substrate, or being provided on another substrate, such as a planarization layer or anti-reflection coating layer.

In use, an imprint lithography template may be held by an imprint lithography template holder. The imprint lithography template holder may hold the imprint lithography template using one of a number of different mechanisms, for example using electrostatic or magnetic forces, mechanical forces (e.g. via the use of piezoelectric elements or the like) or by vacuum forces. The imprint lithography template may be moved by appropriate movement of the imprint lithography template holder. In use, a substrate may be held by a substrate holder. The substrate holder may hold the substrate using one of a number of different mechanisms, for example using electrostatic or magnetic forces, mechanical forces (e.g. a clamp or the like) or by vacuum forces. The substrate may be moved by appropriate movement of the substrate holder.

In the above embodiments, a single imprint lithography template, a single imprint lithography template holder, a single substrate holder and a single substrate is described as being provided, and for example in a single chamber. In other embodiments, more than one imprint lithography template, more than one imprint lithography template holder, more than one substrate holder, and/or more than one substrate may be provided in one or more chambers, in order for imprints to be undertaken more efficiently or quickly (e.g. in parallel). For example, in an embodiment, there is provided an apparatus that includes a plurality (e.g. 2, 3, or 4) of substrate holders. In an embodiment, there is provided an apparatus that includes a plurality (e.g. 2, 3, or 4) of imprint lithography template holders and/or templates. In an embodiment, there is provided an apparatus configured to use one template holder and/or imprint lithography template per substrate holder. In an embodiment, there is provided an apparatus configured to use more than one template holder and/or imprint lithography template per substrate holder. In an embodiment, there is provided an apparatus that includes a plurality (e.g. 2, 3, or 4) of imprintable medium dispensers. In an embodiment, there is provided an apparatus configured to use one imprintable medium dispenser per substrate holder. In an embodiment, there is provided an apparatus configured to use one imprintable medium dispenser per imprint lithography template. In an embodiment, where an apparatus is provided that includes a plurality of substrate holders, the substrate holders may share functionalities in the apparatus. For instance, the substrate holders may share a substrate handler, a substrate cassette, a gas supply system (e.g. to create a helium environment during imprinting), an imprintable medium dispenser, and/or a radiation source (for curing the imprintable medium). In an embodiment, two or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate holders.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

Embodiments of the invention are provided in below numbered clauses:

1. An imprint lithography method comprising, after imprinting an imprint lithography template into a layer of imprintable medium to form a pattern in that imprintable medium and fixing that pattern to form a patterned layer of imprintable medium:
   adding etch resistant material to a part of the patterned layer of imprintable medium, to reduce a difference between an intended topography and an actual topography of that part of the patterned layer of imprintable medium.

2. The imprint lithography method of clause 1, wherein the etch resistant material is added using chemical vapor deposition.

3. The imprint lithography method of clause 1 or clause 2, wherein the etch resistant material is added by heating of the etch resistant material, or a substance from which the etch resistant material is derivable, located in a vicinity of the part of the patterned layer of imprintable medium, or in contact with the part of the patterned layer of imprintable medium.

4. The imprint lithography method of clause 3, wherein the heating is provided using a beam of radiation.

5. The imprint lithography method of clause 3 or clause 4, wherein the heating is provided by directing a beam of radiation toward the patterned layer of imprintable medium, the radiation beam having a radiation intensity profile configured such that etch resistant material is added substantially only to the part of the patterned layer of imprintable medium.

6. The imprint lithography method of clause 3 or clause 4, wherein the heating is provided by scanning a beam of radiation relative to the patterned layer of imprintable medium, the radiation beam being modulated during scanning such that etch resistant material is added substantially only to the part of the patterned layer of imprintable medium.

7. The imprint lithography method of clause 3 or clause 4, wherein the heating is provided by intersecting two or more beams of radiation at a point adjacent to the part of the patterned layer of imprintable medium.

8. The imprint lithography method of any preceding clause, wherein, prior to adding etch resistant material to a part of the patterned layer of imprintable medium, the method comprises providing etch resistant material in fluid form, or a substance from which etch resistant material is derivable, in a vicinity of the part of the patterned layer of imprintable medium, or in contact with the part of the patterned layer of imprintable medium.

9. An imprint lithography method comprising, after imprinting an imprint lithography template into a layer of imprintable medium to form a pattern in that imprintable medium and fixing that pattern to form a patterned layer of imprintable medium:

removing a part of the patterned layer of imprintable medium, to reduce a difference between an intended topography and an actual topography of that part of the patterned layer of imprintable medium, the removal being undertaken using a plasma applied locally to that part of the patterned layer of imprintable medium.

10. The imprint lithography method of clause 9, wherein a plasma is provided using an addressable array of plasma formation sites.

11. The imprint lithography method of clause 10, wherein a pitch between each plasma formation site is around 100 µm or less.

12. The imprint lithography method of clause 10 or clause 11, wherein each plasma formation site comprises a cavity.

13. The imprint lithography method of clause 12, wherein the shape of the cavity is chosen to provide a desired plasma distribution.

14. The imprint lithography method of any of clauses 9 to 13, wherein the plasma is produced using an electrical discharge.

15. The imprint lithography method of clause 14, wherein the electrical discharge is produced using an impulse having a duration of about 10 ns to 300 ns.

16. The imprint lithography method of clause 14 or clause 15, wherein the electrical discharge is produced using impulses having a repetition rate of around 1 MHz.

17. The imprint lithography method of any of clauses 9 to 16, wherein a mask is provided for spatial control of the plasma.

18. The imprint lithography method of any clause dependent on clause 10, wherein a mask is located between the addressable array of plasma formation sites and the patterned layer of imprintable medium for spatial control of plasma.

19. The imprint lithography method of any of clauses 9 to 18, wherein the plasma is produced using an electrical discharge in the presence of a gas comprising one or more of He, Ar, Ne, $N_2$, $H_2$, or a mixture of one or more of He, Ar, Ne, $N_2$, or $H_2$.

20. The imprint lithography method of any preceding clause, wherein the actual topography of the part of the patterned layer of imprintable medium is determined by measuring a topography of the part of the patterned layer of imprintable medium.

21. The imprint lithography method of any preceding clause, wherein the actual topography of the part of the patterned layer of imprintable medium is determined by measuring a topography of a part of the imprint lithography template that was used to form the part of the patterned layer of imprintable medium.

22. A device, or an imprint lithography template, obtained using the imprint lithography method of any preceding clause.

The invention claimed is:

1. An imprint lithography method comprising, after imprinting an imprint lithography template into a layer of imprintable medium to form a pattern in that imprintable medium and fixing that pattern to form a patterned layer of imprintable medium:

adding etch resistant material to a part of the patterned layer of imprintable medium, to reduce a difference between an intended topography and an actual topography of that part of the patterned layer of imprintable medium.

2. The imprint lithography method of claim 1, wherein the etch resistant material is added using chemical vapor deposition.

3. The imprint lithography method of claim 1, wherein the etch resistant material is added by heating of the etch resistant material, or a substance from which the etch resistant material is derivable, located in a vicinity of the part of the patterned layer of imprintable medium, or in contact with the part of the patterned layer of imprintable medium.

4. The imprint lithography method of claim 3, wherein the heating is provided using a beam of radiation.

5. The imprint lithography method of claim 3, wherein the heating is provided by directing a beam of radiation toward the patterned layer of imprintable medium, the radiation beam having a radiation intensity profile configured such that etch resistant material is added substantially only to the part of the patterned layer of imprintable medium.

6. The imprint lithography method of claim 3, wherein the heating is provided by scanning a beam of radiation relative to the patterned layer of imprintable medium, the radiation beam being modulated during scanning such that etch resistant material is added substantially only to the part of the patterned layer of imprintable medium.

7. The imprint lithography method of claim 3, wherein the heating is provided by intersecting two or more beams of radiation at a point adjacent to the part of the patterned layer of imprintable medium.

8. The imprint lithography method of claim 1, wherein the actual topography of the part of the patterned layer of imprintable medium is determined by measuring a topography of the part of the patterned layer of imprintable medium.

* * * * *